United States Patent [19]
Van Schyndel et al.

[11] Patent Number: 6,087,653
[45] Date of Patent: Jul. 11, 2000

[54] LIGHT GUIDE IMPLEMENTATION OF A PROXIMITY DETECTOR

[75] Inventors: Andre John Van Schyndel, Kanata; Jon David Edward Scott; Lorne A. Whitehead, both of Vancouver, all of Canada; Ulrich Buschmann, Elchingen, Germany; Paul John Koens, Ashton, Canada

[73] Assignee: Bell-Northern Research Ltd., Ontario, Canada

[21] Appl. No.: 08/956,097

[22] Filed: Oct. 24, 1997

[51] Int. Cl.[7] .................................. G01J 1/04; G02B 6/26
[52] U.S. Cl. ............................... 250/227.11; 250/227.24; 356/4.01; 385/31
[58] Field of Search .......................... 250/227.11, 227.24, 250/221, 222.1; 356/4.01, 4.07, 73.1, 375; 385/12, 31, 33, 36, 88, 89, 93; 340/555, 556, 557

[56] References Cited

U.S. PATENT DOCUMENTS 5,224,151   6/1993  Bowen et al. ............................. 379/58
5,771,091   6/1998  Paritsky et al. ..................... 250/227.24

*Primary Examiner*—Seungsook Ham
*Assistant Examiner*—Kevin Pyo
*Attorney, Agent, or Firm*—Jordan and Hamburg LLP

[57] ABSTRACT

A proximity detector structure comprising a pair of light guides which are optically isolated from each other, each of the light guides having an end surface at one end thereof, a light source for transmitting light along one of the light guides to its end surface, a light receiver for receiving light carried by another of the light guides, a light emitter at the end surface of the one of the light guides for emitting light carried by the one of the light guides, and a light gathering structure at the end surface of the other of the light guides for receiving light emitted from the light emitter and reflected from an external surface and for passing the received light into the other of the light guides, the light emitter and light gathering structure being shaped so as to couple unreflected light directly from the light emitter to the light gathering structure.

21 Claims, 3 Drawing Sheets

LIGHT GUIDE IMPLEMENTATION OF A PROXIMITY DETECTOR

FIELD OF THE INVENTION

This invention relates to proximity detectors and in particular to an improvement in a reflected light activated proximity detector which can be used in a wireless telephone handset.

BACKGROUND TO THE INVENTION

A proximity detector is used in a wireless telephone handset to detect whether the handset is close to the ear of the user, in order to switch the handset between loudspeaking and handset mode of operation. The proximity detector ensures that the device will not switch to the loudspeaking mode while it is close to the user's ear, thereby safeguarding the hearing of the user from damage caused by high volume sound.

However, the proximity detector can fail, and it is desirable to have it cause the device to fail to a permanent handset mode, rather than to a loudspeaking mode. U.S. Pat. No. 5,224,151, issued Jun. 29, 1993 to Bowen et al describes a proximity detector which uses the reflection of infrared light from the ear of the user to determine proximity. An infrared light emitting device transmits light toward the ear of the user, which is reflected from the ear of the user, the reflected light being received by an infrared receiver. In the absence of receipt of reflected light, an electronic circuit connected to the infrared receiver determines that the device should be in the loudspeaking mode, and switches it into the loudspeaking mode. If the infrared receiver detects reflected light, the electronic circuit concludes that the device should be in the handset mode, and switches it into the handset mode. The device can be characterized as providing a ranging function.

However, if the light emitting device fails, and the handset is used close to the ear of the user, the electronic circuit concludes that there is no reflected light, and causes the device to switch into the loudspeaking mode, creating a danger to the hearing of the user.

To avoid the danger, the aforenoted patent describes the use of a safeguarding structure, in which another infrared transmitter transmits a light signal to the infrared receiver. The signals from the main infrared transmitter and the safeguarding transmitter are modulated. The electronic circuit detects the modulated signals, and through logical processing of the signals determines whether the ranging function provided by the main transmitter—infrared receiver—circuit is operating properly.

However if the main transmitter fails, or if any of the associated drive circuitry fails, the system does not fail safe, since it does not check whether the main infrared transmitter is operating. The result can be operation at high volume, with resulting damage to the user's ear.

In addition, the extra electronic circuitry required to provide the safeguarding function is clearly expensive, particularly when large volumes of devices are to be manufactured, and in an industry where severe price and functionality competition occurs.

SUMMARY OF THE INVENTION

The present invention is a device for providing a ranging function, which does not require the provision of a separate safeguarding light transmitter, nor the logic circuits used in the above-described structure. It provides the safety of failing to a quiet mode, thus safeguarding the user's ear. The present invention uses a portion of the light transmitted by the main transmitter, directed to the light receiver without reflection, as a sample of the light which is transmitted. If the sample disappears in the absence of the reflected light, clearly the transmitter has malfunctioned or the light is otherwise blocked, and no other logical deduction is required to ensure that the device should be switched to the handset mode. Thus, the performance can be substantially safer with a significantly reduced cost than that of the structure described in the patent referenced above.

Further, the structure is formed in a manner in which the light emitter and detector are inexpensively but reliably coupled between a printed circuit board retained in a handset structure, and a location external thereof so that the reflective coupling via the user as well as the above-described direct coupling can be provided.

In accordance with an embodiment of the invention, a proximity detector comprises a light transmitter for transmitting light for reflection from an object, and a light receiver for receiving light reflected from the object. A light bypass path provides a portion of the transmitted light directly from the light transmitter to the light receiver as a determination of the operation of the light transmitter.

In accordance with another embodiment, a proximity detector structure comprises a pair of light guides which are optically isolated from each other, each of the light guides having an end surface at one end thereof. A light source transmits light along one of the light guides to its end surface. A light receiver receives light carried by another of the light guides. A light emitter at the end surface of the first of the light guides emits light carried by the one of the light guides, and a light gathering structure at the end surface of the other of the light guides receives light emitted from the light emitter and reflected from an external surface and passes the received light into the other of the light guides. The light emitter and light gathering structure are shaped so as to couple unreflected light directly from the light emitter to the light gathering structure.

In accordance with another embodiment, a method of making a proximity detector comprises: (a) moulding a pair of light guides having planar end surfaces, each light guide having at least one lens integral with and raised from an end thereof, (b) disposing the light guides into an operating position whereby unreflected light from a first of the light guides can be directly coupled to a second of the light guides via the lenses, (c) applying a predetermined amount of light to the first light guide, (d) directly or indirectly measuring an amount of light received directly, without reflection from an external object, from the other light guide, (e) in the event the amount of light measured does not exceed a predetermined value, adding lenses to the planar end surfaces of the light guides and repeating steps (b), (c) and (d), and (f) in the event amount of light measured meets the predetermined value to a predetermined tolerance, using the resulting light guides others of similar structure in a proximity detector.

BRIEF INTRODUCTION TO THE DRAWINGS

A better understanding of the invention will be obtained by considering the detailed description below, with reference to the following drawings, in which:

FIG. 1 is a front view of a handset such as a wireless handset, with which the present invention can be used, FIG. 2 is a side view illustrating the principles of the present invention, FIG. 2A is an isometric view of a portion of the top of a pair of light guides, in accordance with a preferred embodiment of the invention, FIG. 3 is a side sectional view of another embodiment of the invention, FIG. 4 is a side view of a light guide, FIG. 5 is a plan view of a particular arrangement of light bumps, and FIG. 6 is a side view of two angled light guide surface.

DETAILED DESCRIPTION OF EMBODIMENTS OF THE INVENTION

Figure 1:
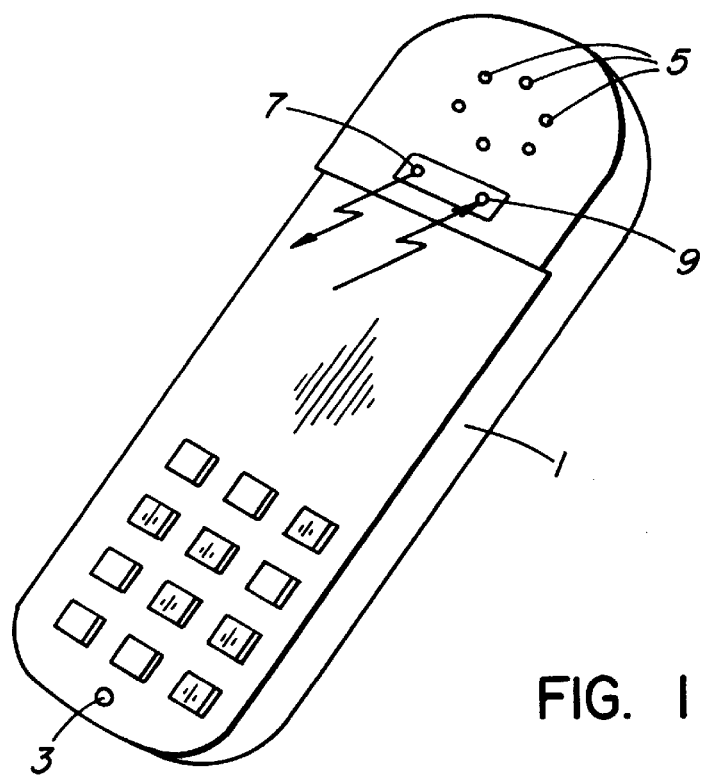

FIG. 1 illustrates a handset 1, which includes a microphone port 3 and a receiver port or ports 5. A receiver (not shown), which can be switched into either handset (quiet) mode or loudspeaking (loud) mode is contained in the handset behind the ports 5. The sound of the receiver in handset mode emanates from the ports 5. In some designs the sound from the receiver in loudspeaking mode emanates from the ports 5, and in other designs from the back of the handset.

A proximity detector is located on the surface of the handset 1. The proximity detector is comprised of a light (of typically infrared wavelengths) emitting diode 7 and a light sensitive device such as a PIN diode 9. As described in the aforenoted patent, light emitted from the light emitting diode is reflected from the ear of the user, the reflected light being received by the diode 9.

Figure 2:
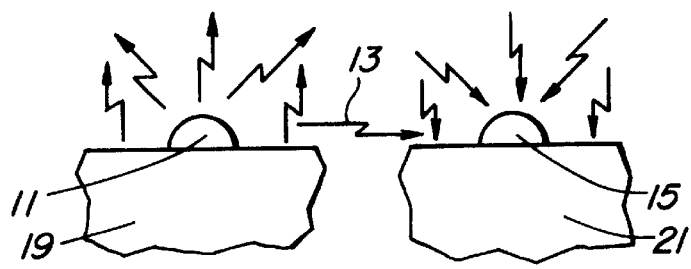

In accordance with the principles of the present invention, as shown in FIG. 2 light from a light emitter 11 is not only reflected from the user, but light 13 from the same light emitter 11 is also coupled directly to a light detector 15 without reflection from the user. This can be provided by the emission of light from a device such as a lens which extends above a plane surface without interruption to a similar lens extending above the plane. A portion of the light 13 will thus be shone directly on the lens of the light detector 15.

The presence of this "bypass" light can be used as a determination that the main light emitter is operational. For example, in the absence of the reflected light the bypass light can cause a constant output signal from a detection circuit connected to the detector. Additional light reflected from the user can raise or lower the output signal; when the amplitude of the output signal is higher or lower than a threshold a user is deemed to be present in handset use position and the device should be switched to handset mode. When the amplitude of the output signal is the constant, from the bypass light, the device is deemed to be away from the ear of the user, and it can be switched to loudspeaking mode.

However, if the bypass light is not present, the light path is either blocked, or not operational. The output signal would then be either lower or higher than another threshold which has value in the opposite voltage direction relative to the constant value than that of the first threshold, and the device is deemed to be inoperative as a proximity detector, and should be switched into the handset mode to protect the hearing of the user.

Figure 3:
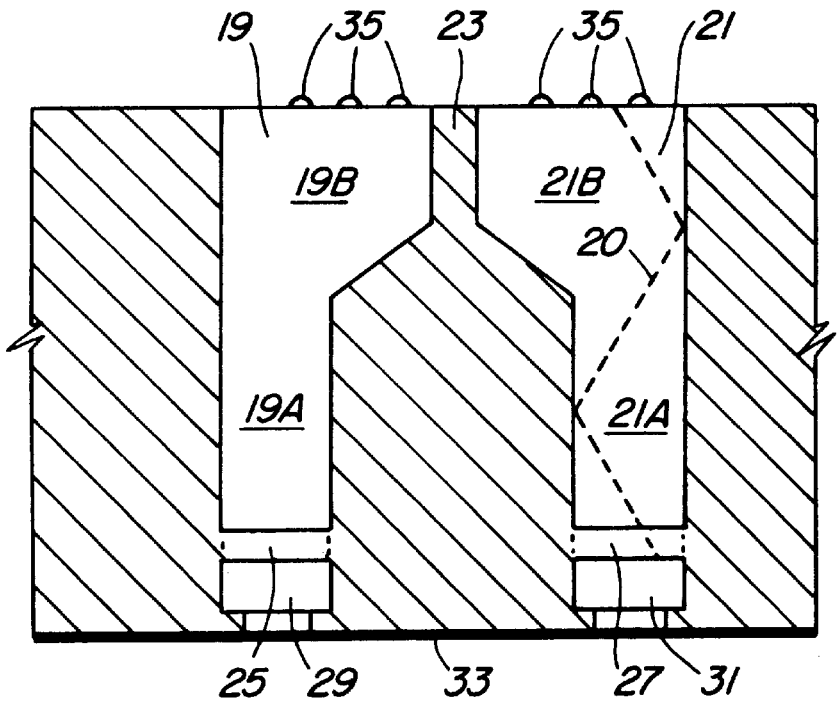

Turning to FIG. 3, a side sectional view of an embodiment of the proximity detector is shown. A pair of light guides 19 and 21, e.g. formed of a clear plastics material, is surrounded on its sides by opaque material 23 such as rubber. The light guides can be formed of relatively narrow elongated sections 19A and 21A, and expanded sections 19B and 21B, the elongated sections tapering into the expanded sections.

Figure 4:
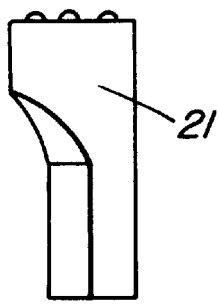

A side view of one of the light guides is illustrated in FIG. 4. Typical dimensions of each light guide can be about 2.5 mm crossection for the elongated section and about 3.3 mm crossection for the expanded section; the elongated section can be about 4.8 mm, the overall length of the light guide can be about 8.5 mm and the length of the tapered section can be about 1.9 mm. The crossections need not be symmetrical, and can be any shape sufficient to carry the light with total internal reflection, to fit the handset or other device with which it is to be used, and to otherwise accommodate other structures of which the present invention is comprised.

It is preferred that the opaque material 23 should extend past the bottom ends of the light guides 19 and 21, and contain tunnels 25 and 27 extending from the bottom ends of the light guides to a bottom surface of the opaque material. A light emitting diode (LED) 29 and a light sensitive device preferably in the form of a PIN diode 31 are fixed to the same surface of a printed circuit board 33, in line with and disposed in the tunnels 25 and 27. The opaque material 23 thus is disposed on the surface of the printed circuit boards, with the LED and PIN diode contained within the tunnels 25 and 27, adjacent the ends of the light guides 19 and 21. The bottom ends of the light guides are preferably in the same plane. The opaque material 23 isolates the LED and PIN diode from each other, and isolates the light guides and tunnels from each other.

The printed circuit board 33 contains operation circuitry (not shown) connected to drive the LED and receive signals from the PIN diode, to switch the handset into handset or loudspeaking mode, etc.

Light such as infrared radiation from the LED 29 is thus passed into the adjacent end of the light guide 19, is guided up the light guide 19 by total internal reflection, emanates from its top surface which is exposed by the opaque material 23, is reflected from the user's ear, is received into the light guide 21 from its top surface exposed by the opaque material, is guided down by total internal reflection (see example light ray 20) to escape its bottom surface and is received by PIN diode 31.

In order to provide direct light coupling, it is preferred that the upper surfaces of the light guides should contain coupling "bumps" 35 , e.g. formed of the same material as that of the light guides. The bumps 35 can be formed integrally with the light guides.

The bumps 35 form small lenses, which transmit or collect light in or from directions orthogonal to their surfaces. Thus light which passes up the light guide 19 is transmitted upwardly from its plane upper surface toward an reflecting object. Some of this light enters the interior of the bumps 15 and is scattered sideways.

The light reflected from the object is received at the plane upper surface of the light guide 21, and is passed down that light guide toward PIN diode 31. However, some of the scattered light enters the bumps 35 at the surface of light guide 21, and is also passed down that light guide, (as shown in FIG. 2). Indeed, in the absence of reflected light, the only light (aside from noise) which passes down the light guide 21 will be the scattered bypass light which is scattered by the bumps 35 at the surface of light guide 19.

In order to obtain maximum scattering of light from the bumps and for scratch immunity, it is preferred that they should be produced with a matte exterior surface.

It may be seen that different designs will result in different amounts of bypass light being received or being required. For example, the spacing between the light bumps, ambient light, the sufficiency of an infrared filter that may be used between the active elements 29 and 31 and the adjacent light guides, the size and efficiency of the light guides, the number of bumps, the size of the bumps 35, etc., can be different in various designs. In accordance with an embodiment of the present invention, the bypass coupling can be tuned by the process described below with respect to FIG. 5.

Figure 2A:
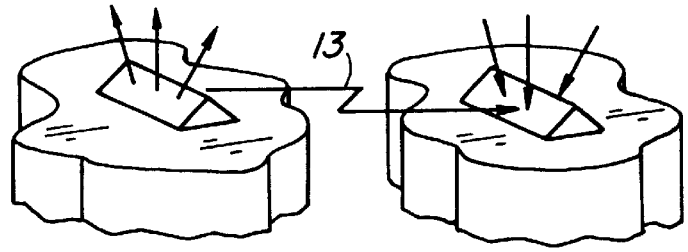

Alternatively, only a single bump can be used, for example a prism shaped bump extending upwardly from the top surface of the light guide, as shown in FIG. 2A. It is preferred that flat surfaces of the prism shaped bumps of the pair of light guides should free each other. Of course more than one prism shaped bump can be used on either or both of the top surfaces of the light guides.

The angles of the side plane surfaces of the prism can be made to optimize the relative reflection from the reflecting object and the direct coupling. In one successful embodiment, one side plane surface was 53° from the horizontal and the other side plane surface was 45° from the horizontal. The linear top edges of the light emitter and light collector prisms were parallel in order to maximum mutual coupling.

Figure 5:
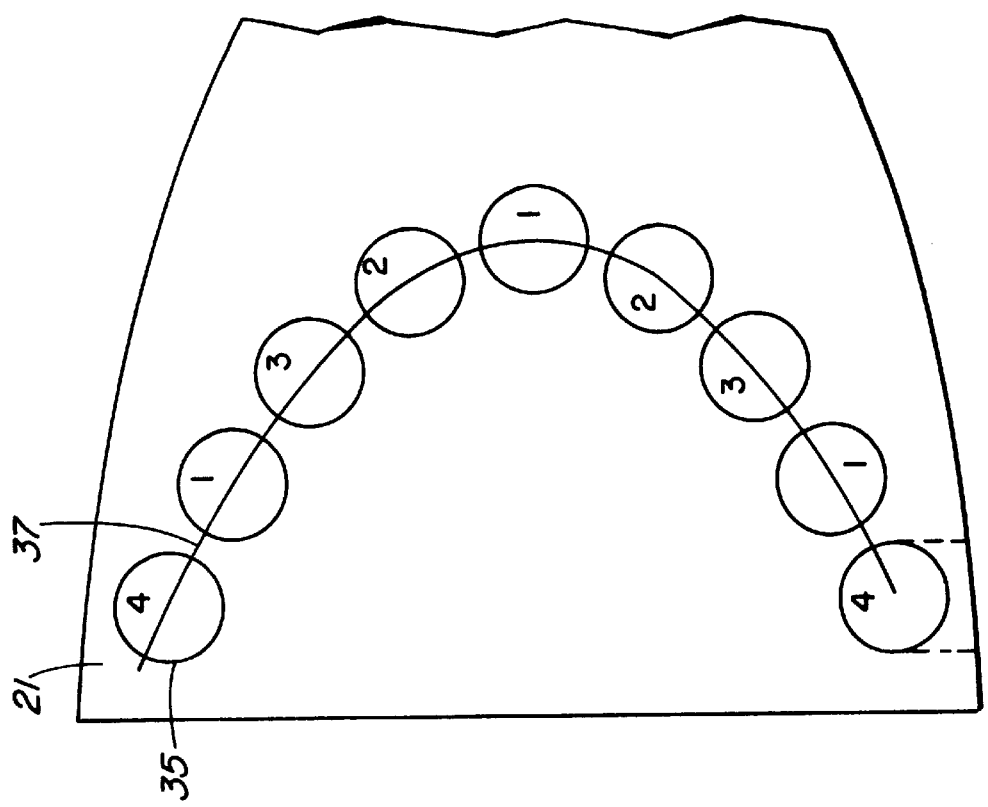
Figure 5:
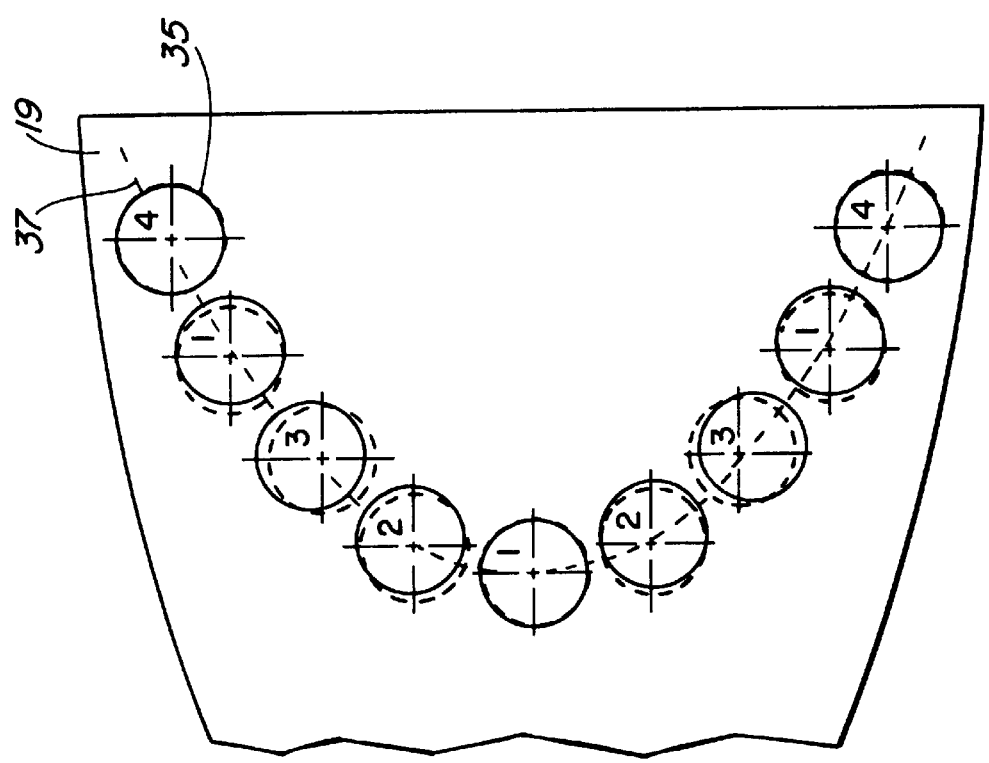

FIG. 5 illustrates arcs 37 along which plural hemispheric bumps 35 can be formed. In the first embodiment the arcs are parts of ellipses which face each other, with a common axis. The bumps are located on the upper plane coplanar surfaces of the light guides 19 and 21.

In a particular design, the bumps identified by a circled 1 are moulded to the top surfaces of light guides 19 and 21. Only those on light guide 21 are circularly numbered, since the structure of those on light guide 19 are the same. Preferably the bumps each have radius of about 0.2 mm.

As shown in FIG. 5, only three bumps are produced on the light guide 19 and three bumps are produced on the light guide 21.

The light guides are then placed into a testing operating environment in accordance with the design, and the coupling is measured. If the desired amount of coupling is not present, e.g. by measuring the signal resulting from the direct bypass light, the light guides are removed and additional bumps preferably at the locations shown by the circled 2 are added. The light guides are then again tested as described above. If necessary, bumps at the locations designated by the circled 3, then by the circled 4 are successively added, until the desired amount of coupling is achieved. Bumps can be added by cementing them to the tested light guides, or newly moulded light guides can be produced with the required number and placement of bumps.

In this manner the light guides can be tuned to the required amount of direct coupling for a particular design.

The present invention thus provides a structure which has efficient transfer of light from optoelectronic active components to the exterior of the device housing, obtains easily modified coupling between light transmitter and receiver, has a reliable seal between the light guides and optoelectronic components and between light guides, provides a relatively inexpensive means of providing failure detection, and allows manufacture of handset devices with easily changeable light guides and direct light coupling structures while using the same printed circuit board and active component locations.

Figure 6:
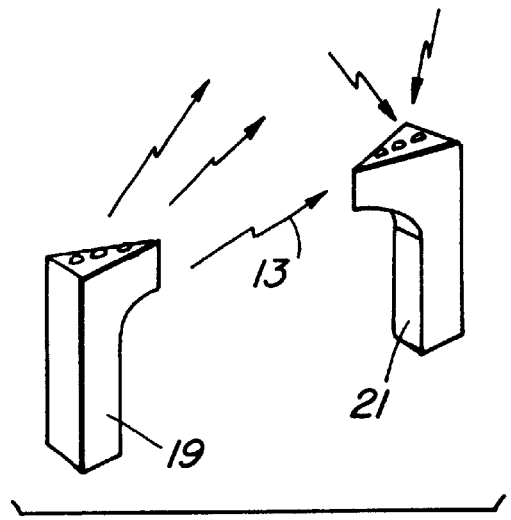

As an alternative to using bumps, the light guide exterior surfaces can be angled toward each other, as shown in FIG. 6. This will also provide coupling of light 13 scattered from the upper exposed surface of one of the light guides to the other. The amount of coupling can be controlled by the angle of the exterior surfaces 19, 21 toward each other, by a barrier of controllable size located between the surfaces, and/or by the shapes of the exterior surfaces.

A person understanding this invention may now conceive of alternative structures and embodiments or variations of the above. All those which fall within the scope of the claims appended hereto are considered to be part of the present invention.

We claim:

1. A proximity detector structure comprising a pair of light guides which are optically isolated from each other, each of the light guides having an end surface at one end thereof, a light source for transmitting light along one of the light guides to its end surface, a light receiver for receiving light carried by other of the light guides, a light emitting structure at the end surface of the one of the light guides for emitting light carried by the one of the light guides, and a light gathering structure at the end surface of the other of the light guides for receiving light emitted from the light emitting structure and reflected from an external surface and for passing the received light into the other of the light guides, the light emitting structure and light gathering structure being shaped so as to couple unreflected light directly from the light emitting structure to the light gathering structure.

2. A proximity detector as defined in claim 1 in which the end surfaces are planar in shape and are located in a single plane.

3. A proximity detector as defined in claim 1 in which the light emitting structure and light gathering structure are shaped so as to couple a predetermined amount of unreflected light from the light emitting structure to the light gathering structure.

4. A proximity detector as defined in claim 3 in which the light emitting structure and light gathering structure are comprised of lenses protruding from the end surfaces and located so as to provide mutual light coupling therebetween.

5. A proximity detector as defined in claim 4 in which the end surfaces are planar in shape and are located in a single plane.

6. A proximity detector as defined in claim 5 in which the lenses are integral with the light guides.

7. A proximity detector as defined in claim 6 including plural ones of said lenses protruding from the end surfaces, at least one of the number, size and location of the lenses defining the predetermined coupled amount of unreflected light.

8. A proximity detector as defined in claim 7 in which the lenses are located along arcs having a coincident axis.

9. A proximity detector as defined in claim 4 in which the light emitting structure and light gathering structure are each comprised of a prism-shaped lens protruding from the end surfaces of the light guides.

10. A proximity detector as defined in claim 9 in which the prism-shaped lenses each includes a rectangular plane surface terminating in a top edge, said top edges being mutually parallel.

11. A proximity detector as defined in claim 2 in which the light guides have generally parallel longitudinal axes, other end surfaces of the light guides being located in a single plane, a light emitting diode being disposed adjacent the other end surface of the one light guide and a light sensitive diode being disposed adjacent the other end surface of the other light guide.

12. A proximity detector as defined in claim 11 wherein said diodes are supported on a printed circuit board, the light guides being supported so as to locate the other ends thereof adjacent said diodes.

13. A proximity detector as defined in claim 12 in which the light guides are encapsulated in opaque material, the surfaces at the one ends thereof being exposed at a surface of the opaque material.

14. A proximity detector as defined in claim 13 wherein the opaque material contains a pair of tunnels extending from the other ends of the light guides to another surface of the opaque material, the diodes being located within the tunnels whereby the opaque material forms a barrier to direct light transmission between the diodes.

15. A proximity detector as defined in claim 7 in which the light guides have generally parallel longitudinal axes, other end surfaces of the light guides being located in a single plane, a light emitting diode being disposed adjacent the other end surface of the one light guide and a light sensitive diode being disposed adjacent the other end surface of the other light guide.

16. A proximity detector as defined in claim 15 wherein said diodes are supported on a printed circuit board, the light guides being supported so as to locate the other ends thereof adjacent said diodes.

17. A proximity detector as defined in claim 16 in which the light guides are encapsulated in opaque material, the surfaces at the one ends thereof being exposed at a surface of the opaque material.

18. A proximity detector as defined in claim 17 wherein the opaque material contains a pair of tunnels extending from the other ends of the light guides to another surface of the opaque material, the diodes being located within the tunnels whereby the opaque material forms a barrier to direct light transmission between the diodes.

19. A proximity detector as defined in claim 1 in which the end surfaces are inclined toward each other so as to couple unreflected light directly from the light emitter to the light gathering structure.

20. A proximity detector as defined in claim 11 in which the light emitting structure and light gathering structure are each comprised of a prism-shaped lens protruding from the end surfaces of the light guides.

21. A proximity detector as defined in claim 20 in which the prism-shaped lenses each includes a rectangular plane surface having a top edge, said top edges being mutually parallel.

* * * * *